United States Patent
Peters et al.

(10) Patent No.: US 9,587,816 B2
(45) Date of Patent: Mar. 7, 2017

(54) MODULAR LIGHTING ASSEMBLY ADAPTER PART

(75) Inventors: Ralph Hubert Peters, Aachen (DE); Harald Willwohl, Aachen (DE); Bas Fleskens, Eindhoven (NL); Theodoor Cornelis Treurniet, Best (NL)

(73) Assignee: PHILIPS LIGHTING HOLDING B.V., Eindhoven (NL)

( * ) Notice: Subject to any disclaimer, the term of this patent is extended or adjusted under 35 U.S.C. 154(b) by 260 days.

(21) Appl. No.: 14/236,108

(22) PCT Filed: Jul. 23, 2012

(86) PCT No.: PCT/IB2012/053731
§ 371 (c)(1),
(2), (4) Date: Jan. 30, 2014

(87) PCT Pub. No.: WO2013/017984
PCT Pub. Date: Feb. 7, 2013

(65) Prior Publication Data
US 2014/0160773 A1    Jun. 12, 2014

Related U.S. Application Data

(60) Provisional application No. 61/514,123, filed on Aug. 2, 2011.

(51) Int. Cl.
*F21V 23/06* (2006.01)
*F21S 8/10* (2006.01)
(Continued)

(52) U.S. Cl.
CPC ............. *F21V 23/06* (2013.01); *F21S 48/115* (2013.01); *F21S 48/1109* (2013.01);
(Continued)

(58) Field of Classification Search
CPC ............ H01R 13/7175; H01R 13/6641; H01R 13/6683; H01R 13/6658; H01R 31/065; F21V 23/06
(Continued)

(56) References Cited

U.S. PATENT DOCUMENTS 4,412,273 A     10/1983  Helbig et al.
5,759,067 A  *  6/1998   Scheer ............... H01R 13/6641
                                                    439/607.26
(Continued)

FOREIGN PATENT DOCUMENTS

DE    102005018175 A1   10/2006
EP        1217807 A1    6/2002
(Continued)

*Primary Examiner* — Gary Paumen

(57) ABSTRACT

The invention describes an adapter part (2, 9) for a modular lighting assembly (1) comprising a number of light-emitting diodes (4) mounted on a separate base part (3), which adapter part (2, 9) comprises a number of first electrical connectors (21) arranged to connect the light-emitting diodes (4) to an external power supply; at least one electrical component (5) arranged in a body of the adapter part (2, 9); and a number of second electrical connectors (22) arranged to connect external circuitry to an electrical component (5) arranged in the body of the adapter part (2, 9). The invention further describes a modular lighting assembly (1) comprising a base part (3) upon which a number of light-emitting diodes (4) is mounted; and an adapter part (2, 9) according to the invention. The invention also describes a method of assembling such a modular lighting arrangement (1), comprising the steps of connecting a first adapter part (2, 9) according to the invention to a separate base part (3); choosing a number of electrical components (5, 6) on the basis of an application requirement of the modular lighting arrangement (1); and arranging an electrical component (5, 6) in the adapter part (2, 9) such that an electrical connection
(Continued)

is formed between a contact surface of the electrical component (5, 6) and a second electrical connector (22) of the adapter part (2, 9).

14 Claims, 4 Drawing Sheets

(51) Int. Cl.
| | |
|---|---|
| *H01R 13/66* | (2006.01) |
| *H01R 13/717* | (2006.01) |
| *H01R 31/06* | (2006.01) |
| *F21K 99/00* | (2016.01) |
| *F21V 19/00* | (2006.01) |
| *H05K 1/18* | (2006.01) |

(52) U.S. Cl.
CPC ...... *F21S 48/1154* (2013.01); *H01R 13/6608* (2013.01); *H01R 13/7175* (2013.01); *H01R 31/065* (2013.01); *F21K 9/00* (2013.01); *F21V 19/002* (2013.01); *F21V 19/0055* (2013.01); *H05K 1/18* (2013.01); *H05K 2201/049* (2013.01); *H05K 2201/10106* (2013.01); *H05K 2201/10189* (2013.01)

(58) Field of Classification Search
USPC ................ 439/520.22, 620.21, 638; 362/282
See application file for complete search history.

(56) References Cited

U.S. PATENT DOCUMENTS

| | | | |
|---|---|---|---|
| 5,961,335 A * | 10/1999 | Kubernus | ............ H01R 9/2658 |
| | | | 439/713 |
| 7,274,105 B2 | 9/2007 | Fairchild et al. | |
| 7,547,922 B2 | 6/2009 | Tan et al. | |
| 7,736,156 B2 * | 6/2010 | Ko | .................... H01R 43/0256 |
| | | | 439/76.1 |
| 2003/0189828 A1 | 10/2003 | Coushaine | |
| 2004/0253849 A1 | 12/2004 | Kuribayashi et al. | |
| 2008/0305658 A1 * | 12/2008 | Ko | .................... H01R 13/5808 |
| | | | 439/76.1 |
| 2010/0244649 A1 | 9/2010 | Inaba | |
| 2010/0277916 A1 | 11/2010 | Kira | |
| 2011/0074294 A1 | 3/2011 | Song et al. | |

FOREIGN PATENT DOCUMENTS

| | | |
|---|---|---|
| EP | 1309043 A2 | 5/2003 |
| EP | 2218962 A2 | 8/2010 |
| EP | 2228596 A1 | 9/2010 |
| FR | 2918158 A1 | 1/2009 |
| JP | 2011077040 A | 4/2011 |
| WO | 2006030191 A1 | 3/2006 |
| WO | 2007034361 A1 | 3/2007 |
| WO | 2007071397 A1 | 6/2007 |
| WO | 2010060420 A1 | 6/2010 |
| WO | 2012086528 A1 | 6/2012 |

* cited by examiner

MODULAR LIGHTING ASSEMBLY ADAPTER PART

FIELD OF THE INVENTION

The invention describes a modular lighting assembly adapter part, a modular lighting assembly, and a method assembling a modular lighting assembly.

BACKGROUND OF THE INVENTION

The design of known automotive lighting applications based on light-emitting diodes is characterized by highly customized and cost intensive solutions. A large cost factor is presented by the need to include sensors in an LED-based automotive lighting assembly. Typically, an LED-based lighting assembly comprises one or more LED chips mounted to a printed circuit board (PCB) or insulated metal substrate (IMS) by soldering or gluing. Any other additional components, for example components required for added electronic functionality, and the necessary connectors, are soldered to the board. These manufacturing techniques are complex and therefore quite cost intensive. Furthermore, PCB and IMS techniques involve soldering steps. The thermal performance of such an LED-based lighting assembly is limited due to the solder-based technologies used in manufacture. For example, the operating temperature of the finished lighting assembly may be limited to a maximum of about 125° C. to avoid failure of the soldered connections. However, LED-based lighting assemblies of the type described above generate higher ambient temperatures during operation on account of the very high junction temperatures in the diodes. These ambient temperatures can exceed this maximum allowable operating temperature, so that soldered connections in the vicinity of the diodes might fail. Therefore, in the field of automotive LED lighting, thermal management is becoming a key challenge, particularly since production volume is expected to increase substantially.

Therefore, it is an object of the invention to provide an improved LED-based lighting assembly that avoids the problems described above.

SUMMARY OF THE INVENTION

The object of the invention is achieved by the modular lighting assembly adapter part of claim 1, by the modular lighting assembly of claim 9, and by the method of claim 14 of assembling a modular lighting assembly.

According to the invention, the adapter part for a modular lighting assembly, comprising a number of light-emitting diodes mounted on a separate base part, comprises a number of first electrical connectors arranged to connect the light-emitting diodes to an external power supply; at least one electrical component arranged in a body of the adapter part; and a number of second electrical connectors arranged to connect external circuitry to the electrical component arranged in the body of the adapter part. The power supply and the external circuitry could comprise separate circuits, but might equally well be realised as parts of a driver of the lighting assembly.

An advantage of the modular lighting assembly adapter part according to the invention is that the adapter part provides a thermal interface with a favourable internal thermal resistance, a mechanical interface allowing favourably precise positioning and easy mounting of electrical components, and also an electrical connector interface for these components. Since the electrical components are included or arranged in the body of the adapter part, they are essentially thermally de-coupled from the LEDs on the base part, so that the design challenges of an LED-based lighting assembly can be solved in a favourably straightforward manner by the modular lighting assembly adapter part according to the invention. This permits the LEDs in the module to be driven such that higher external temperatures are reached, while at the same time requiring less effort for thermal management issues correspondingly lower production costs. Furthermore, the modular lighting assembly adapter part according to the invention can be designed for one of several different applications independently of the base part, while additional application-specific functions are fulfilled by the electrical component(s) arranged in the body of the adapter part. This ensures high application flexibility while allowing favourably small dimensions.

According to the invention, the modular lighting assembly comprises a base part upon which a number of light-emitting diodes is mounted; and an adapter part according to the invention.

According to the invention, the method of assembling such a modular lighting arrangement comprises the steps of connecting such a first adapter part to a separate base part; choosing a number of electrical components on the basis of an application requirement of the modular lighting arrangement; and arranging an electrical component in the adapter part such that an electrical connection is formed between a contact surface of the electrical component and a second electrical connector of the adapter part.

An advantage of the modular lighting assembly according to the invention and the method of its assembly is that a modular lighting assembly can be assembled or manufactured in a particularly straightforward manner for the application in which it is to be used. By using a single base part type and combining this with various different adapter part types, it is easy to obtain different modular lighting assemblies for different applications or purposes. For example, a single base part design can be designed for mounting in various lighting housings. Different adapter parts can be designed to fulfil the relevant requirements, for example by using appropriate electrical components in the bodies of the adapter parts. The modular lighting assembly according to the invention allows increased integration of functionality into the lighting assembly, so that LED-based lighting applications are made more economical to realise.

Particularly advantageous embodiments and features of the invention are given by the dependent claims, as revealed in the following description. Features described in the context of one claim category can apply equally to another claim category. Features of the different claim categories may be combined as appropriate to arrive at further embodiments.

In the following, but without restricting the invention in any way, it may be assumed that the light-emitting diodes mounted on the base part are high-power light emitting diodes, and that the emitter surfaces of these are exposed, i.e. the light-emitting diodes are not encapsulated by a surrounding body such as a plastic dome, so that essentially all of the emitted light can be used directly by the device in which the modular lighting assembly is to be used. Furthermore, again without restricting the invention in any way, it may be assumed that the modular lighting assembly is designed for use in an automotive lighting application, preferably an automotive front lighting application such as a front headlight for generating a low beam and/or a high beam.

The electrical component(s) can be arranged in or on the body of the adapter part in any appropriate fashion. For example, a component can be mounted on an outside surface of the adapter part. In a preferred embodiment of the invention, the adapter part comprises one or more first cavities in the body of the adapter part, wherein a first cavity is shaped to accommodate one or more electrical components. An electrical component can therefore simply be inserted or pushed into the appropriate cavity in the body of the adapter part, whereby the cavity itself acts to retain the component in place. A cavity might be a simple recess in a flat outer surface of an adapter part, or may comprise a specific moulded shape in the case of a moulded adapter part, as will be explained below.

In order to obtain a favourably compact design, the adapter part comprises one or more second electrical connectors, which are shaped according to the first cavity. In other words, a second connector has a shape adapted to the shape of the first cavity. For example, if the cavity exhibits interior surfaces arranged at specific angles to each other, the second connector can be shaped in a complementary manner so that it can effectively lie against the interior surfaces of the cavity.

An electrical component could be physically bonded to a second electrical connector, for example by using electrically conductive glue or solder. However, in some applications, such connections may not be able to withstand the high temperatures generated by the LEDs during operation, as mentioned in the introduction. Therefore, in a particularly preferred embodiment of the invention, an electrical connection between a second electrical connector and an electrical component comprises a solderless pressure connection, for example a contact between conductive surfaces. In a further preferred embodiment of the invention, a second electrical connector is shaped to receive an electrical component inserted into the body of the adapter part, and to hold that component in place. For example, one end of a second electrical connector can be shaped as a spring and can be pre-loaded, so that it presses against an electrical component inserted under the spring part. Alternatively, the second electrical connector can be shaped in the manner of a snap connector, with a small 'nose' at one end that snaps into place over an electrical component when that electrical component is pushed past or under the nose. Preferably, a cavity of the adapter part and the second electrical connector are shaped in a complementary manner, so that an electrical component arranged in the cavity is held in place by a combined retaining action of the cavity and the second electrical connector. An advantage of such connector shapes is that an electrical component can be easily inserted into the adapter part, and can equally easily be removed again should the need arise. However, the main advantage of using such connectors to secure the components in the body of the adapter part is that effectively no solder connections such as PCB or IMS connections need to be made, and the purely mechanical surface-to-surface pressure contacts between component and second electrical connector are extremely robust and will not deteriorate when exposed to high temperatures.

The electrical component arranged in or on the body of the adapter part can be any component that serves to provide added functionality to the modular lighting assembly. For example, the electrical component can comprise a bin-code resistor that acts as an identifier for driver electronics, indicating which current level to apply to the LED in order to establish constant lumen output. Alternatively or in addition, the electrical component can comprise a temperature sensor such as a thermistor for sensing a temperature in the modular lighting assembly, for example a negative temperature coefficient (NTC) thermistor or a positive temperature coefficient (PTC) thermistor. Preferably, a temperature sensor is mounted in or on the adapter part such that a minimal temperature gradient is achieved over the body of the temperature sensor. In the following, for simplicity, the terms "temperature sensor" and "thermistor" may be used interchangeably. The components listed here are examples of passive electrical components, and any suitable off-the-shelf components can be used. In the following therefore, but without restricting the invention in any way, it may be assumed for simplicity that an electrical component embedded or otherwise arranged in the body of the adapter part preferably comprises a passive component. Of course, an active component requiring a power supply—e.g. a transistor or other semiconductor device—could be arranged in the body of the adapter part and could be connected to an external power supply.

As mentioned above, an LED lighting assembly can become very hot during operation. An additional cooling may be applied, for example a fan can direct a cooling airflow over some part of the modular lighting assembly. A temperature sensor could therefore be used to determine whether the cooling should be increased or not. A measured temperature can also provide information about the functionality of the LEDs. For example, an excessively high temperature could indicate a junction failure. Therefore, in a preferred embodiment of the modular lighting assembly according to the invention, an electrical component arranged in the body of the adapter part comprises a temperature sensor arranged such that, in an assembled state of the modular lighting assembly, the temperature sensor is arranged in thermal proximity to the light-emitting diodes mounted on the base part. By locating the temperature sensor—for example a thermistor—close to the heat source itself, in this case the LEDs, the signal generated by the thermistor can give a reliable indication of the temperature of the LEDs. Such a signal can be passed via the second electrical connectors of the thermistor to an exterior module such as a controller. For example, a controller might monitor the signal delivered by the thermistor to determine whether additional cooling is required for the LEDs are functioning as they should, or whether an LED failure is likely.

The adapter part may be attached to a base part in any appropriate manner, for example using a number of screws or other fasteners, or by gluing. However, fasteners can be time-consuming to manipulate, and glue might deteriorate over time as a result of the high temperatures. Therefore, in a preferred embodiment of the invention, the adapter part comprises a first engaging means for mechanically connecting the adapter part to the physically separate base part, whereby the first engaging means can comprise any suitable mechanical connecting means. For example, the adapter part might be formed to include one or more studs on its under-surface, which studs can be dimensioned to fit into corresponding holes or recesses in the base part. An advantage of such a connection is that the adapter part can be very simply and reliable connected to the base part. Furthermore, the adapter part can relatively easily be removed or detached from the base part at a later point in time, for example if the existing adapter part is to be replaced by a new or different adapter part.

The adapter part can be realised in a number of ways, and can be realised to suit the geometry of the base part. Preferably, the adapter part is realised in accordance with the operating conditions in which the modular lighting assembly is to be implemented. For example, the choice of material to be used for the adapter part may depend on the temperatures that might be reached during operation of the LEDs. Since a high-power LED becomes very hot during operation, it is very important to effectively dissipate the heat. Therefore, preferably, the base part comprises a heat spreader made of a good thermal conductor. For example, the base part can be made of metal such as copper. The adapter part should also be able to withstand the high temperatures without any deformation. Therefore, the adapter part is preferably made of a mouldable temperature-resistant liquid crystal polymer (LCP) such as Vectra® or Stanyl®.

In a preferred embodiment of the invention, the adapter part comprises an opening dimensioned to accommodate at least the light-emitting diodes mounted on the separate base part. For example, the opening can be shaped to allow the light-emitting diodes (and any substrate or other body on which they are mounted) to protrude through the opening; or it can be shaped to partially cover such a substrate and/or an emitting surface of an LED. In such a realisation, essentially only the LEDs and their anode and cathode contact surfaces are exposed by the opening of the adapter. The environmental conditions may also govern whether the use of a soldered connection is desirable or not. The use of a mouldable material such as an LCP allows the adapter part to be moulded in one piece, and the electrical components to be effectively incorporated in the body of the adapter part. In another embodiment of the invention, the adapter part can comprise a printed circuit board (PCB) substrate or carrier arranged around or beside the base part. Any electrical components can be mounted in or on the PCB carrier, and are therefore effectively thermally decoupled from the base part. An interface part comprising the first electrical connectors can be arranged at a suitable position on the PCB carrier. Such an interface part can comply with a standard socket design, for example, or may comprise a proprietary socket design. One or more electrical components can be arranged in or on the body of the PCB carrier for example by soldering. To this end, the electrical connectors can be embedded in the body of the PCB carrier, while an electrical component can be inserted entirely or only partially into a recess in the PCB or surface mounted using established techniques. Particularly in the case of a temperature sensor, it may be desirable to incorporate a thermal bridge from a point close to the LEDs to the temperature sensor, which thermal bridge is preferably embedded in the PCB. In this embodiment of the adapter part, the second electrical connectors for connecting external circuitry to the electrical component(s) can also be embedded in the PCB using the established PCB manufacturing techniques.

For either type of realisation, the adapter part is preferably shaped to fit the base part. As an alternative to the realisations described above, having an opening to accommodate the LEDs, the adapter part may be shaped to abut or fit alongside the base part. For example, the base part and/or the adapter part may comprise step shapes, so that one end of the adapter fits over a shaped end of the base part. Evidently, the adapter part and the base part preferably comprise a close fit.

In a preferred embodiment of the modular assembly according to the invention, the base part comprises a second engaging means for engaging with a first engaging means of the adapter part, so that the base part and the adapter part can be connected mechanically, i.e. without requiring any adhesive or fasteners. Preferably, the engaging means are realised to press a base part surface against a corresponding adapter part surface, so that these surfaces effectively lie against each other. For example, the engaging means can be realised so that an essentially flat under-surface of the adapter part is pressed against an essentially flat upper surface of the base part upon which the LEDs are mounted. With the materials mentioned above and a mechanical engaging means such as a snap-fit connection, the modular lighting assembly effectively comprises two parts capable of withstanding high temperatures, assembled by means of a temperature-resistant mechanical connection.

With such a design, a thermistor or other temperature sensor for measuring or sensing the heat generated by the LEDs could be arranged in a cavity on the underside of the adapter part, so that at least one face or surface of the thermistor lies against the upper surface of the base part, while the thermistor body itself is held in a suitably-shaped recess or cavity of the adapter part. An established thermal relationship between the heat generated by the LEDs and the temperature of the base part, particularly if this is made of a good thermal conductor such as copper, can be used to interpret the measurements made by the thermistor and delivered to an external controller module. Such a relationship can be established in a calibration step. A thermistor can also be wrapped or encapsulated in a thermal envelope or thermal bridge, for example a thin metal foil, in order to optimally transfer heat to the thermistor and to improve the accuracy of the measured readings. As indicated above, a thermistor is preferable located directly beside the heat source, or at least close to the heat source. If such a position is not possible, the thermistor could be located at some distance from the heat source, and a thermal bridge—for example a thin wire or metal foil—could extend from the thermistor to a point close to the heat source. In this way, the thermistor can indirectly sense the relevant temperature and deliver a reliable signal to a controller. In another preferred embodiment, a region of the heat sink in the vicinity of the LEDs could be formed to extend into a cavity of the adapter part in which a thermistor is embedded, so that the temperature of the heat sink can be directly transferred or 'communicated' to the thermistor. In a further preferred embodiment, the thermistor itself can be over-moulded inside an additional shroud or cavity with a low thermal conductivity, which shroud is shaped to open onto the heat sink or base part. In this way, heat leakage from a space between the thermistor and the adapter part can effectively be minimized. The embodiments using a thermistor described herein have the advantages of a minimal and well-defined thermal resistance between the heat source (the LEDs) and the temperature sensor In addition to the mechanical and electrical interfaces mentioned above, the adapter part, more specifically the opening in the adapter part, can preferably be realised to act also as an optical interface, which optical interface is dimensioned to at least partially surround the light-emitting diodes. For example, an opening of the adapter part can be shaped to connect to near-die optics mounted at a later stage. The opening can comprise a ridge, a groove, or any other connecting means for attaching a collimator to the adapter part in order to shape the light emitted by the LEDs. Alternatively, the adapter part itself can be shaped to provide optical functionality. For example, the body of the adapter part in a region surrounding the opening can be moulded or shaped to act as a collimator, or can be shaped to accommodate a collimator.

The engaging means of the base part and adapter part can be realised to be opened or disconnected from each other at a later point. This might become necessary in the event of a defect, for example. Therefore, the method according to the invention preferably comprising the steps of removing an existing adapter part from the base part; and replacing it by another adapter part, wherein the dimensions of the replacement adapter part and/or the electrical components arranged in a body of the replacement adapter part and/or the second electrical connectors of the replacement adapter part are different from those of the first adapter part. In this way, an existing modular lighting assembly according to the invention can be upgraded as desired, or a defective element—whether the defect lies in the adapter part or the base part—can easily be replaced. The adapter part and/or the base part can also comprise further referencing means for correct positioning of the module with regard to optical requirements of the lighting arrangement in which it is to be used.

As mentioned above, the modular lighting assembly according to the invention is particularly suited for use in an automotive lighting arrangement. Therefore, some means of attaching the modular lighting assembly to a carrier or part of a housing would be advantageous. Therefore, in a preferred embodiment of the invention, the base part comprises a connecting means realised to accommodate at least one fastener for connecting the modular lighting assembly to a further component. For example, the base part—which is generally made of metal and is therefore robust—can be formed with a number of through-holes or recesses for accommodating one or more bolts or screws, so that base part can be firmly connected or attached to an appropriate part of a housing. The connecting means can be arranged on the base part so that the adapter part can be disconnected from the base part and replaced by a replacement adapter part, should the need arise.

BRIEF DESCRIPTION OF THE DRAWINGS

In the drawings, like numbers refer to like objects throughout. Objects in the diagrams are not necessarily drawn to scale.

DETAILED DESCRIPTION OF THE EMBODIMENTS

Figure 1:
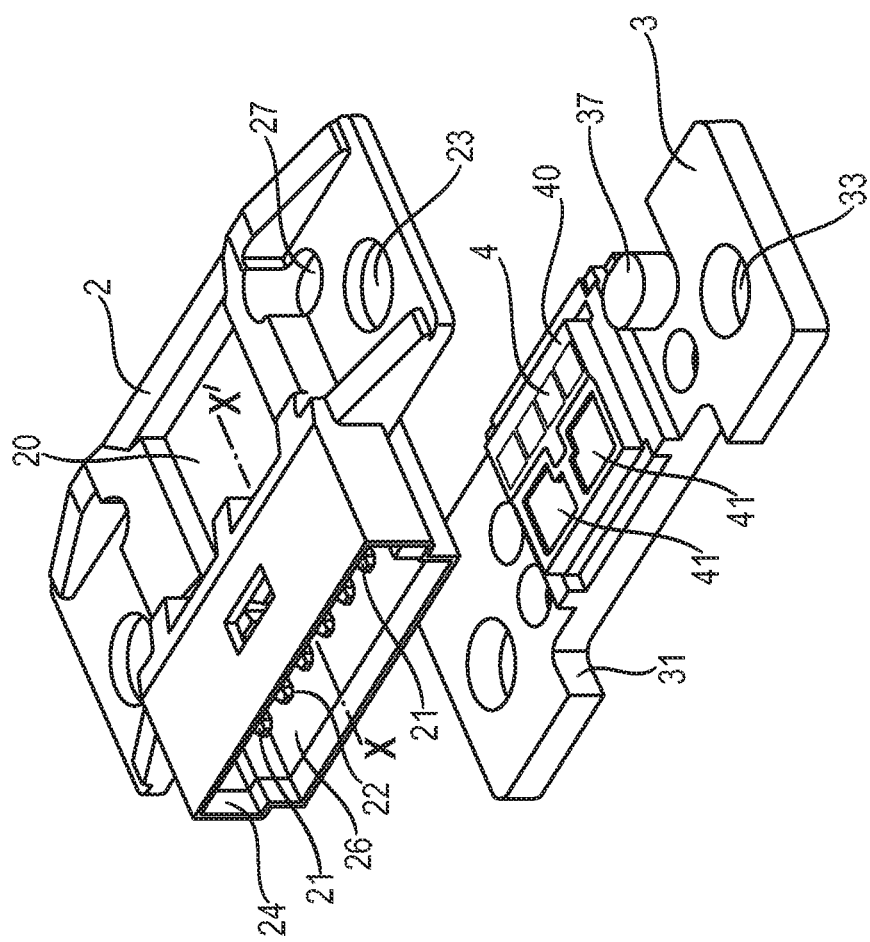
FIG. 1 shows an adapter part and a base part for a modular lighting assembly according to a first embodiment of the invention.

FIG. 1 shows an adapter part 2 and a base part 3 for a modular lighting assembly according to a first embodiment of the invention. The base part 3 comprises a block of copper or other good heat conducting metal, upon which a substrate 40 with an array of exposed LEDs 4 is mounted. The diagram also shows contact surfaces 41 for later connecting a voltage across the anode and cathode of the LED array. The adapter part 2, moulded from an LCP material, has an opening 20 or optical interface 20 shaped to fit closely about the LED substrate 40. Furthermore, the adapter part 2 comprises an electrical interface 24 comprising a socket portion 24 shaped to accommodate several electrical connectors 21, 22 used to connect the LEDs 4 and other electrical components to external circuitry. The electrical components may be embedded or otherwise arranged in the body of adapter part, as will be explained below, while the electrical connectors 21, 22 can extend into a cavity 26 of the socket portion 24, which cavity 26 can be shaped to accommodate an appropriately shape plug, as will be clear to the skilled person. The adapter part 2 and the base part 3 comprise engaging means 27, 37, in this case an opening 27 in the adapter part 2 arranged to accommodate a stud 37 of the base part 3, whereby the stud 37 is designed to fit snugly in the opening 27 of the adapter part 2.

Figure 2:
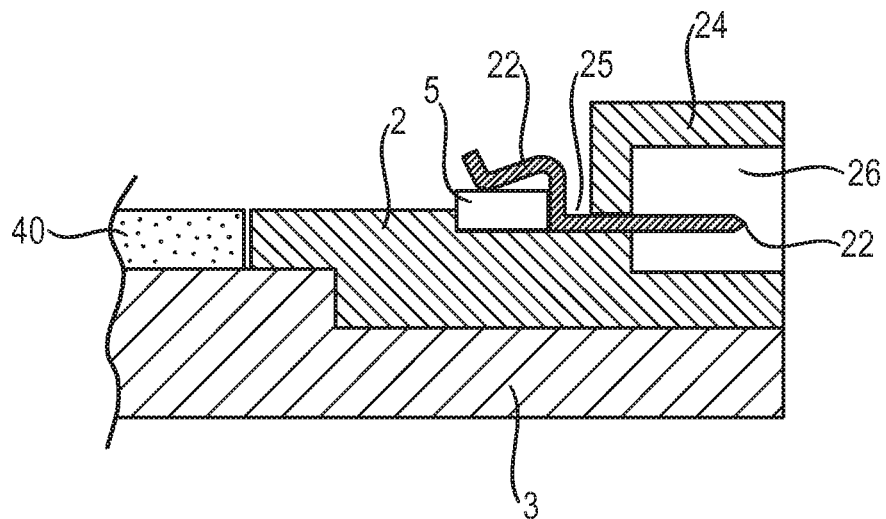
FIG. 2 shows a cross-section through a detail of a modular lighting assembly according to a first embodiment of the invention.

FIG. 2 shows a cross-section X-X' through a detail of the adapter part 2 and base part 3 of a modular lighting assembly 1 according to a first embodiment of the invention. Here, the adapter part 2 comprises a first cavity 25 or recess 25 shaped to accommodate one or more second electrical connectors 22. In this example, a second electrical connector 22 is shaped at one end to press down in a spring-loaded manner onto a contact surface of an electrical component 5 such as a bin-code resistor 5, and at the other end to extend as a pin 22 into the second cavity 26 in the socket portion 24 of the adapter part 2. The bin-code resistor 5 can easily be inserted into the first cavity 25 and under the spring portion of the electrical connector 22, facilitating ease of assembly. This diagram indicates the interaction between the component 5, the electrical connector 22, and the walls of the cavity 25 in which the component 5 is inserted. Because of the shape of the second electrical connector 22 and the snug fit in the cavity 25, the component 5 is firmly held in place without the need for any soldering. First electrical connectors, also incorporated in the socket portion 24 of the adapter part 2, not shown in this cross-section, can be connected to the anode and cathode of the LEDs using, for example, wire or ribbon bonds. The first electrical connectors may have the same shape as the second electrical connectors 22 shown here, or may be shaped differently, since they will be used to contact the anode and cathode of the LED circuit and may not require such a spring-loaded function.

Figure 3:
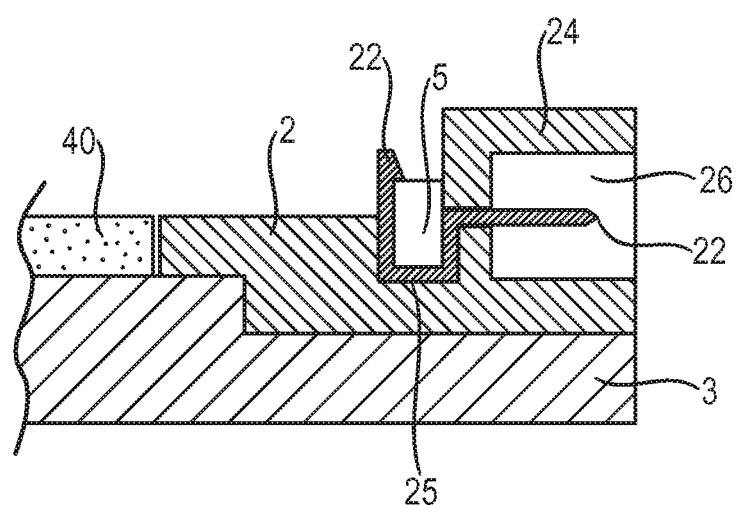
FIG. 3 shows a cross-section through a detail of a modular lighting assembly according to a second embodiment of the invention.

FIG. 3 shows a cross-section through a detail of an adapter part 2 and base part 3 of a modular lighting assembly 1 according to a second embodiment of the invention. Here, the second electrical connectors 22 have a somewhat different shape, and such an electrical connector 22 is designed to snap over an electrical component 5 which is pushed into place. This diagram also indicates the advantageous physical interaction between the component 5, the electrical connector 22, and the walls of the cavity in which the component 5 is inserted. The shape of the second electrical connector 22 in this embodiment allows more possibilities for an electrical surface-to-surface pressure contact between the electrical connector 22 and the component 5, since the electrical connector 22 is firmly pressed against the component 5 on four of its faces. Again, first electrical connectors, not shown here, can be connected to the anode and cathode of the LEDs using, for example, wire or ribbon bonds.

Figure 4:
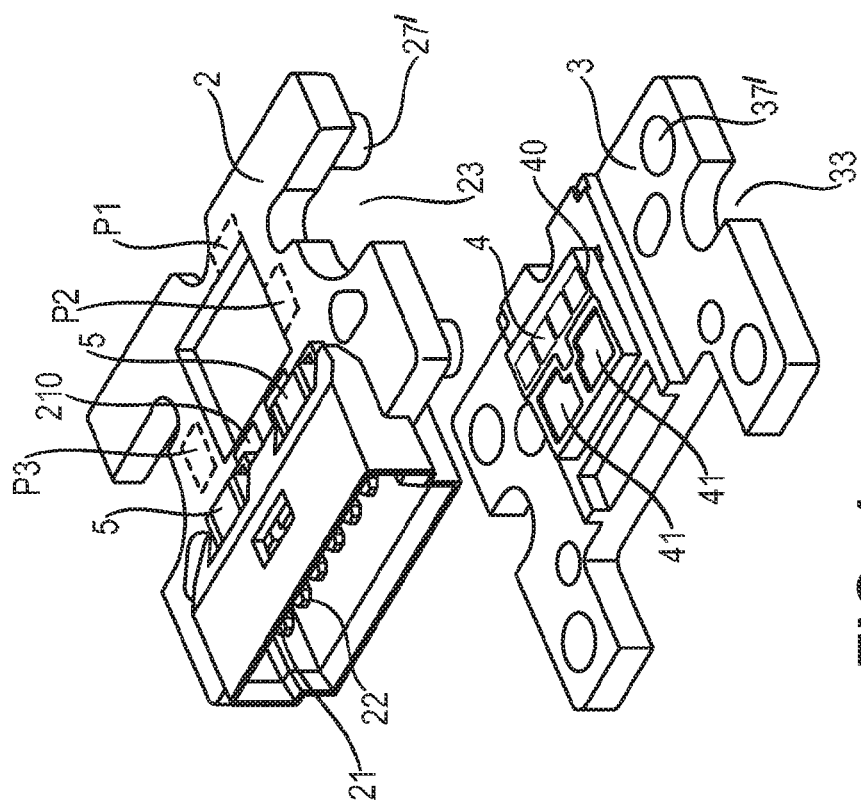
FIG. 4 shows various possible positions for a temperature sensor in the modular lighting assembly of FIG. 1.

FIG. 4 shows various suitable positions P1, P2, P3 for a thermistor incorporated in the adapter part 2 of the modular lighting assembly of FIG. 1. Depending on the thermistor being used, and/or on the capabilities of the manufacturing process, and/or on the temperatures expected to be achieved during operation of the lighting assembly 1, the thermistor could be positioned at a first position P1 in direct proximity to the LEDs or at a second position P2 along the edge of the substrate 40. If it is not possible to use positions P1 or P2, the thermistor may be located at a suitable point P3 between the adapter part 2 and the base part 3, particularly if the thermal relationship between the temperature of the base part 3 and the temperature of the LEDs 4 can be established in advance. For any of these positions P1, P2, P3, electrically conductive leads are connected between thermistor contacts and second electrical connectors 22, so that an external temperature monitoring module can be supplied with temperature values during operation of the modular lighting assembly. Alternatively, one of the further electrical components 5 could comprise a thermistor, which might be thermally connected to the LEDs by means of a thermal bridge embedded in the adapter part body. The LEDs 4 can be connected to external circuitry such as a power supply by electrically connecting the anode 41 and cathode 41 to contact surfaces 210 of the adapter part 2, which contact surfaces 210 in turn are connected to two first electrical connectors 21 extending into the socket part 24. In this embodiment, the further electrical components 5 are used independently of each other so that each of these requires two second electrical connectors 22. The LED circuit requires two first electrical connectors 21, so that a total of six electrical connectors 21, 22 is incorporated in the adapter part 2. This diagram shows alternative engaging means 27', 37' for firmly connecting the adapter part 2 to the base part 3, and openings 23, 33 shaped to accommodate a fastener, as will be explained below.

Figure 5:
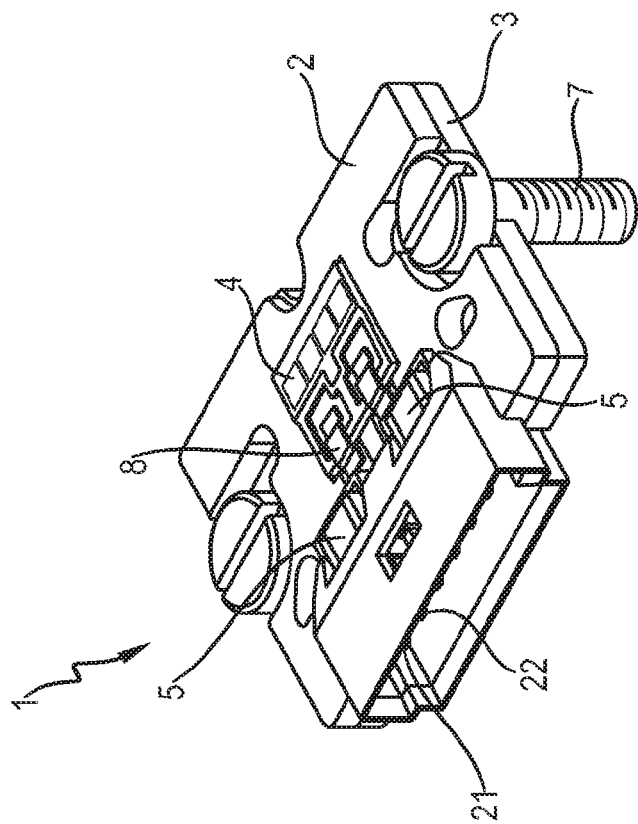
FIG. 5 shows the modular lighting assembly of FIG. 4 in its assembled state.

FIG. 5 shows the modular lighting assembly 1 of FIG. 4 in its assembled state. As described above, the adapter part 2 fits closely onto the base part 3 by means of the engaging means 27, 27', 37, 37' (no longer visible here). The LEDs 4 can be connected to external circuitry such as a power supply via first electrical connectors 21 electrically connected to the anode 41 and cathode 41 by means of connectors 8 such as ribbon binds 8 or wire bonds 8 applied between the contact surfaces 41, 210. Further electrical components 5 provide additional functionality and can provide information to an external module or controller via second electrical connectors 22 incorporated into the body of the adapter part 2. The entire modular lighting assembly 1 can be mounted onto a carrier, for example in the housing of a front lighting module, by means of fasteners 7 extending through the openings 23, 33 of the adapter part 2 and the base part 3.

Figure 6:
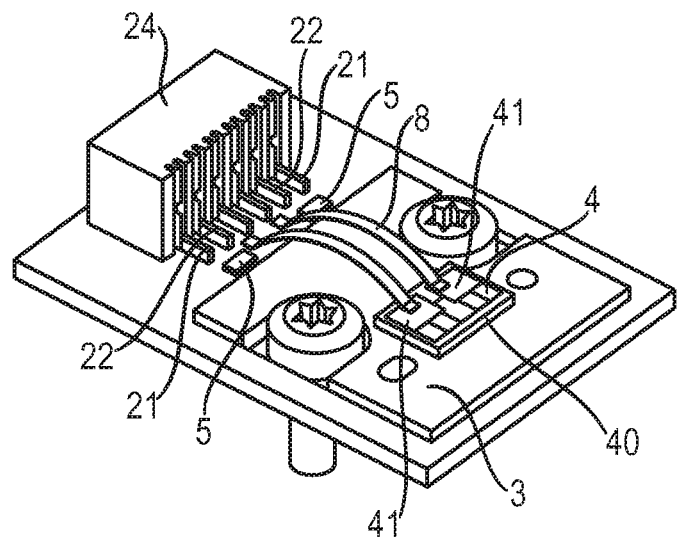
FIG. 6 shows a modular lighting assembly according to a third embodiment of the invention.

FIG. 6 shows an alternative realisation of a modular lighting assembly according to the invention. Here, the adapter part 9 comprises a PCB substrate 90 or carrier 90 incorporating a socket 24 and further electrical components 5. The socket 24 and electrical components 5 can be soldered or otherwise connected to the PCB substrate 90. In this embodiment, the PCB substrate 90 is shaped to comprise an opening dimensioned to fit around a raised part of a heat spreader 3 or base part 3. Two of the first electrical connectors 21 are bonded to the anode and cathode of the LEDs by means of wire bonds 8. The surface mounted electrical components 5 are connected to second electrical connectors 22 by means of tracks embedded in the PCB substrate 90.

Figure 7:
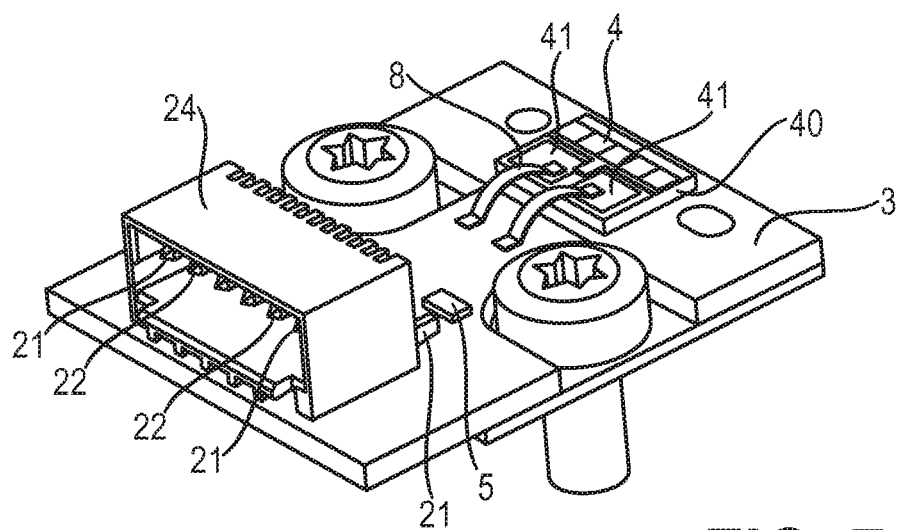
FIG. 7 shows a modular lighting assembly according to a fourth embodiment of the invention.

FIG. 7 shows another alternative realisation of a modular lighting assembly according to the invention. Here, the adapter part 9 comprises a PCB substrate 90 shaped to abut a raised part of a heat spreader 3, which comprises a step to accommodate the PCB substrate 90. Again, wire bonds 8 are used to connect first electrical connectors 21 incorporated in the socket 24 to the anode 41 and cathode 41 of the LED circuit 4. The base part 3 can be connected to the PCB adapter part 9 by any suitable adhesive or mechanical connection, for example a snap-fit connection.

Although the present invention has been disclosed in the form of preferred embodiments and variations thereon, it will be understood that numerous additional modifications and variations could be made thereto without departing from the scope of the invention. For example, the adapter part could have more than one socket part enclosing second electrical connectors, so that the adapter part can cooperate with two or more plugs, and these socket parts can be shaped to accommodate different plug designs. Furthermore, one or more of the embedded further electric components could be connected in series or in parallel with the LEDs mounted on the base plate, if this is desired. To this end, the first electrical connectors can comprise connections between contacts of one or more further electrical components to the anode and cathode of the LED circuit, so that the LEDs are indirectly supplied with current via the second electrical connectors incorporated in the body of the adapter part.

For the sake of clarity, it is to be understood that the use of "a" or "an" throughout this application does not exclude a plurality, and "comprising" does not exclude other steps or elements. A reference to a "unit" or "module" does not exclude a plurality of units or modules.

The invention claimed is:

1. An adapter part for a modular lighting assembly, said modular lighting assembly comprising a number of light-emitting diodes on a separate base part, said adapter part configured to be mountable on said base part and comprising at least one electrical component and an electrical interface configured for connecting the light-emitting diodes and the at least on electrical component to circuitry outside the modular lighting assembly, the electrical interface comprising:
   a plurality of first electrical connectors configured to connect the light-emitting diodes; and
   a plurality of second electrical connectors configured to connect the electrical component.

2. The adapter part according to claim 1, comprising a first cavity in the body of the adapter part, which first cavity is shaped to accommodate at least one electrical component and/or at least one second electrical connector.

3. The adapter part according to claim 1, wherein a second electrical connector comprises a shape adapted to the shape of the first cavity.

4. The adapter part according to claim 1, wherein an electrical connection between a second electrical connector and an electrical component comprises a pressure connection.

5. The adapter part according to claim 1, wherein a second electrical connector is shaped to receive an electrical component inserted into the body of the adapter part.

6. The adapter part according to claim 1, wherein an electrical component comprises any of a bin-code resistor or a temperature sensor.

7. The adapter part according to claim 1, comprising an opening dimensioned to accommodate at least the light-emitting diodes mounted on the separate base part.

8. The adapter part according to claim 1, comprising a first engaging means for mechanically connecting the adapter part to the separate base part.

9. A modular lighting assembly comprising
   a base part upon which a number of light-emitting diodes is mounted; and
   an adapter part according to claim 1.

10. A modular lighting assembly according to claim 9, wherein the base part comprises a heat spreader.

11. A modular lighting assembly according to claim 9, wherein the adapter part comprises an optical interface, which optical interface is dimensioned to at least partially surround the light-emitting diodes.

12. A modular lighting assembly according to claim 11, wherein the base part comprises a connecting means configured to accommodate at least one fastener for connecting the modular lighting assembly to a further component.

13. A modular lighting assembly according to claim 9 wherein an electrical component arranged in the body of the adapter part comprises a temperature sensor, which temperature sensor is arranged in thermal proximity to the light-emitting diodes mounted on the base part.

14. The adapter part according to claim 1, wherein the at least on electrical component is arranged in a body of the adapter part.

\* \* \* \* \*